(12) United States Patent
Soh

(10) Patent No.: US 12,453,065 B2
(45) Date of Patent: Oct. 21, 2025

(54) EMISSIVE DISPLAY DEVICE

(71) Applicant: Samsung Display Co., LTD., Yongin-si (KR)

(72) Inventor: Yongkwon Soh, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 484 days.

(21) Appl. No.: 18/093,312

(22) Filed: Jan. 4, 2023

(65) Prior Publication Data
US 2023/0262948 A1 Aug. 17, 2023

(30) Foreign Application Priority Data

Feb. 15, 2022 (KR) .................. 10-2022-0019615

(51) Int. Cl.
H05K 9/00 (2006.01)
H10H 20/857 (2025.01)

(52) U.S. Cl.
CPC ......... *H05K 9/0054* (2013.01); *H10H 20/857* (2025.01)

(58) Field of Classification Search
None
See application file for complete search history.

(56) References Cited

U.S. PATENT DOCUMENTS

| | | | | |
|---|---|---|---|---|
| 2021/0318718 A1* | 10/2021 | Ahn | ................... | H10K 50/80 |
| 2021/0378107 A1* | 12/2021 | Hwang | ............. | G02F 1/133331 |
| 2022/0336369 A1* | 10/2022 | Lee | ................... | G06F 1/1637 |
| 2023/0015839 A1* | 1/2023 | Han | ................... | H10K 59/873 |
| 2024/0281036 A1* | 8/2024 | Lee | ................... | G06F 1/1656 |
| 2025/0056982 A1* | 2/2025 | Kim | ................... | H10K 59/1201 |

FOREIGN PATENT DOCUMENTS

| | | | | |
|---|---|---|---|---|
| CN | 116110283 A | * | 5/2023 | ........... G06F 3/0412 |
| CN | 117437850 A | * | 1/2024 | ............. H05K 5/02 |
| CN | 119212455 A | * | 12/2024 | ........... H10K 59/131 |
| CN | 222485234 U | * | 2/2025 | ............. H01L 24/75 |
| JP | 7349493 B2 | * | 9/2023 | ............. H10K 59/88 |
| KR | 1020200065187 | | 6/2020 | |
| KR | 1020210037092 | | 4/2021 | |
| KR | 1020210092873 | | 7/2021 | |
| KR | 102631933 B1 | * | 2/2024 | ......... H10K 59/8722 |
| KR | 20240170650 A | * | 12/2024 | ....... G02F 1/133305 |

* cited by examiner

Primary Examiner — Michael Lebentritt
(74) Attorney, Agent, or Firm — CANTOR COLBURN LLP

(57) ABSTRACT

An emissive display device includes: a display panel including a plurality of pixels and an alignment mark positioned on a rear surface thereof; a metal plate disposed on the rear surface of the display panel, where an alignment mark opening corresponding to the alignment mark is defined through the metal plate, and the metal plate includes a step portion positioned close to the alignment mark opening; and a spacer disposed to overlap at least a portion of the step portion in a plan view and attached to a rear surface of the metal plate.

20 Claims, 15 Drawing Sheets

EMISSIVE DISPLAY DEVICE

This application claims priority to Korean Patent Application No. 10-2022-0019615, filed on Feb. 15, 2022, and all the benefits accruing therefrom under 35 U.S.C. § 119, the content of which in its entirety is herein incorporated by reference.

BACKGROUND

1. Field

The present disclosure relates to an emissive display device, and more particularly, to a flexible emissive display device including a metal plate and a spacer on a rear surface thereof.

2. Description of the Related Art

A display device such as an organic light emitting diode display includes a display panel, and the display panel is manufactured to include several layers and elements on a substrate. Conventionally, glass has been used as a substrate of a display panel. However, since the glass substrate is rigid, it is difficult to bend or deform the display device. Recently, a flexible display device using a flexible substrate made of, e.g., plastic which is light and easy to deform has been developed.

The flexible display device may be classified into a bendable display device, a foldable display device, a rollable display device, and the like depending on its usage and form. Such a flexible display device may be bent or folded using a flexible substrate including or made of, e.g., plastic.

SUMMARY

Embodiments provide an emissive display device in which a spacer is attached to a rear surface of a metal plate at an accurate position.

An embodiment provides an emissive display device including: a display panel including a plurality of pixels and an alignment mark positioned on a rear surface thereof; a metal plate disposed on the rear surface of the display panel, where an alignment mark opening corresponding to the alignment mark is defined through the metal plate and the metal plate includes a step portion positioned close to the alignment mark opening; and a spacer disposed to overlap at least a portion of the step portion in a plan view and attached to a rear surface of the metal plate.

In an embodiment, the metal plate may include a main body including a metal or an alloy and an oxide film disposed on the main body.

In an embodiment, the main body may include titanium, and the oxide film may be a titanium oxide film.

In an embodiment, the oxide film may not be in the step portion.

In an embodiment, a thickness of the step portion may be smaller than a thickness of the main body.

In an embodiment, a portion of the spacer overlapping the step portion in the plan view may be separated from the metal plate by a space above the step portion, and a remaining portion of the spacer may be in contact with the metal plate.

In an embodiment, the metal plate may further include one main mesh pattern portion and two sub-mesh pattern portions which are respectively positioned at opposite sides of the main mesh pattern portion.

In an embodiment, the display panel may further include a display substrate on which a pixel including a transistor and a light emitting diode is disposed, and a lower film layer that is attached to a rear surface of the display substrate, an open portion may be defined through the lower film layer to overlap a bending portion of the display substrate, the bending portion of the display substrate may be folded toward a rear surface, and a distance between bent portions of the display substrate may be maintained by the spacer.

In an embodiment, the display panel may have a cross-sectional shape of a dumbbell in a state where the display panel is bent.

In an embodiment, the emissive display device may further includes a driver positioned on a portion of the display substrate bent toward the rear surface thereof to overlap a display area.

In an embodiment, the emissive display device may further include plurality of island-shaped protrusions positioned on a rear surface of the metal plate, and the island-shaped protrusions may be formed by plating.

An embodiment provides an emissive display device including: a display panel including a plurality of pixels and an alignment mark positioned on a rear surface thereof; a metal plate disposed on the rear surface of the display panel, where an alignment mark opening corresponding to the alignment mark is defined through the metal plate and a plating portion is positioned on the metal plate to be close to the alignment mark opening; and a spacer disposed to overlap at least a portion of the plating portion in a plan view and attached to a rear surface of the metal plate.

In an embodiment, the metal plate may include a main body including a metal or an alloy and an oxide film disposed on the main body.

In an embodiment, the main body may include titanium, and the oxide film may be a titanium oxide film.

In an embodiment, the plating portion may be positioned on the oxide film.

In an embodiment, the emissive display device may further include a plurality of island-shaped protrusions positioned on a rear surface of the metal plate, and the island-shaped protrusions may be formed by plating.

In an embodiment, the island-shaped protrusions may include a same material as a material of the plating portion.

In an embodiment, the island-shaped protrusions and the plating portion may be portions plated on the metal plate with nickel.

In an embodiment, the metal plate may further include one main mesh pattern portion and two sub-mesh pattern portions which are respectively positioned at opposite sides of the main mesh pattern portion.

In an embodiment, the display panel may have a cross-sectional shape of a dumbbell in a state where the display panel is bent.

According to embodiments, a display panel is folded toward a rear surface thereof by attaching a spacer to a back of the plate at a correct position, such that the display panel is not allowed to be folded beyond a certain level, thereby effectively preventing the display panel from being broken.

DETAILED DESCRIPTION

Figure 1:
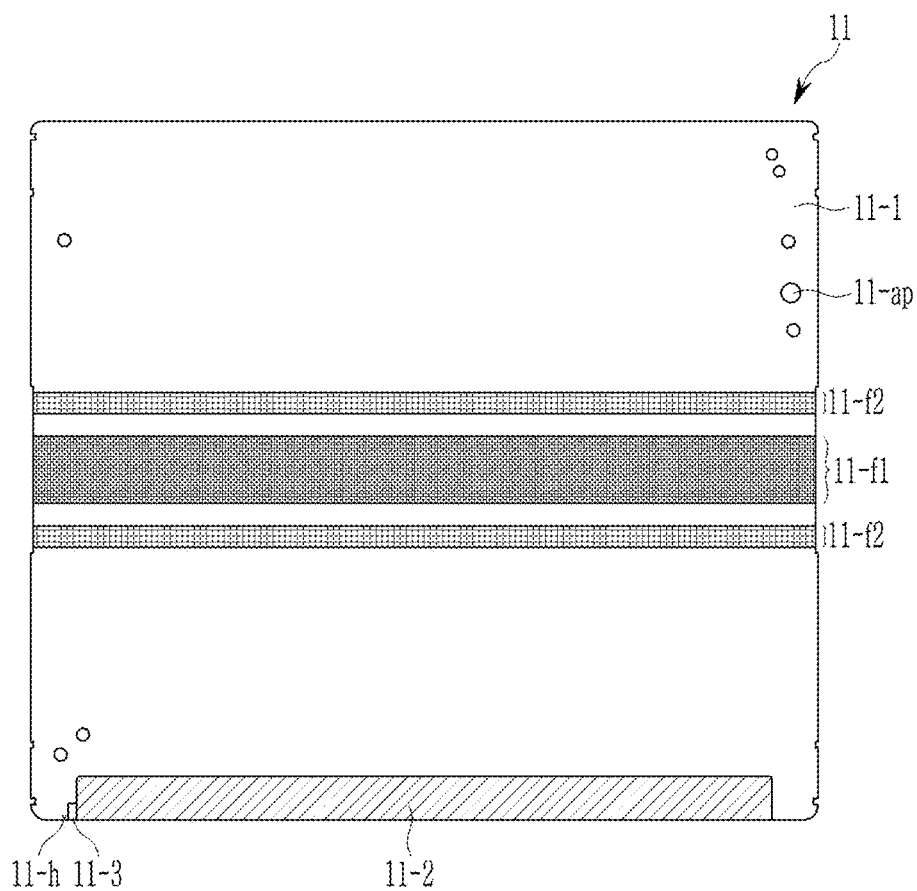
FIG. 1 illustrates a top plan view of a rear surface of a metal plate according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, in the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to be different names depending on the location or function, but may include connecting each of parts that are substantially integral to each other.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, an electronic device (e.g., a mobile phone, TV, monitor, notebook computer, etc.) including a display device, a display panel, etc. described in the specification, or an electronic device including a display device and a display panel manufactured by the manufacturing method described in the specification, are not excluded from the scope of the disclosure.

Hereinafter, a structure of a metal plate 11 attached to a rear surface of an emissive display device will be described with reference to FIG. 1.

FIG. 1 illustrates a top plan view of a rear surface of a metal plate according to an embodiment.

In an embodiment, the metal plate 11 is attached to the rear surface of the emissive display device, and when the flexible or bendable emissive display device is folded, the metal plate 11 serves to maintain a folded state without being unfolded again. A main body 11-1 of the metal plate 11 may be formed to include various metals or alloys of the metals, and may be formed to have a thin thickness to have a flexible characteristic. In addition, an oxide film 11-12 (see FIG. 4) may be formed on at least one surface of the main body 11-1 of the metal plate 11 while a metal or alloy constituting the main body 11-1 is oxidized. According to an embodiment, the main body 11-1 of the metal plate 11 includes titanium. In an embodiment, for example, the main body 11-1 may be formed of a titanium alloy, and an oxide film (hereinafter also referred to as a titanium oxide film) of the titanium alloy is positioned on one surface of the main body 11-1. In general, the metal or alloy constituting the main body 11-1 of the metal plate 11 has high light reflectivity, while the oxidized oxide film of the metal or alloy has relatively low light reflectivity. In particular, compared to the titanium alloy, a titanium oxide film has low light reflectivity.

In an embodiment, the metal plate 11 may include mesh pattern portions 11-$f1$ and 11-$f2$ positioned on a rear surface of a folded portion of the emissive display device. The mesh pattern portions 11-$f1$ and 11-$f2$ have a mesh structure in which a plurality of openings is defined. In an embodiment, as shown in FIG. 1, the metal plate 11 may include one main mesh pattern portion 11-$f1$ and two sub-mesh pattern portions 11-$f2$ at opposite sides thereof. The mesh pattern portions 11-$f1$ and 11-$f2$ may reduce tensile stress or compressive stress generated by folding of the metal plate 11.

In an embodiment, as shown in FIG. 1, the metal plate 11 may include the main body 11-1 positioned on opposing sides of the two sub-mesh pattern portions 11-$f2$, and the main body 11-1 is also positioned between the main mesh pattern portion 11-$f1$ and the sub-mesh pattern portion 11-$f2$. When folded, the main body 11-1 may have a larger radius of curvature than that of the main mesh pattern portion 11-$f1$, and the sub-mesh pattern portion 11-$f2$, so the main body 11-1 may be a portion that is relatively less fold.

The main mesh pattern portion 11-$f1$ and the sub-mesh pattern portion 11-$f2$ may define or have openings of different sizes, so a size of the mesh structure may be different from each other in the main mesh pattern portion 11-$f1$ and the sub-mesh pattern portion 11-$f2$. In an embodiment, the main mesh pattern portion 11-$f1$ may be formed to have a larger width than that of the sub-mesh pattern portion 11-$f2$.

Figure 12:
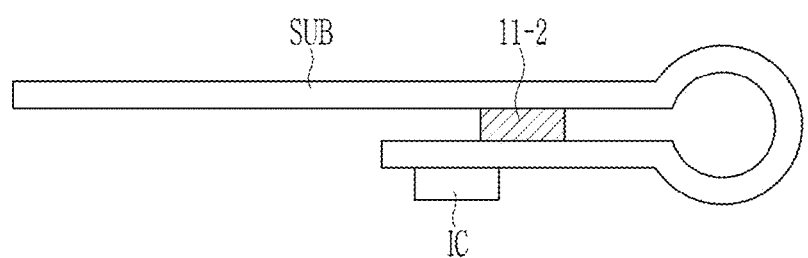
FIG. 12 illustrates a schematic cross-sectional view of an emissive display device according to an embodiment.

In an embodiment of FIG. 1, a cross-sectional shape of the metal plate 11 may have a dumbbell shape as illustrated in FIG. 12 by including one main mesh pattern portion 11-$f1$ and two sub-mesh pattern portions 11-$f2$. In such an embodiment, when folded to have a first diameter (or radius of curvature) by the main mesh pattern pa 11-$f1$, the metal plate 11 may have the dumbbell shape as a gap between portions that are not folded while being additionally folded by two mesh pattern portions 11-$f2$ at opposite sides is formed at a narrower interval than that of the first diameter.

According to an alternative embodiment, the metal plate 11 may be formed only by the main mesh pattern portion 11-$f1$ without including one mesh pattern portion, i.e., the sub-mesh pattern portion 11-$f2$, and may further include an additional mesh pattern portion in another portion. In such an embodiment, the additionally formed mesh pattern portion may also include one main mesh pattern portion 11-$f1$ and two sub-mesh pattern portions 11-$f2$, or may be formed of only one mesh pattern portion. A plurality of positions of the emissive display device may be folded into a dumbbell shape by the additionally formed mesh pattern portion. The metal plate 11 may include two or more portions that are folded to have the dumbbell shape, and in such an embodiment, the metal plate 11 may be folded to have the dumbbell shape in three positions.

In an embodiment, an opening 11-$h$ for an alignment mark is defined through the metal plate 11. In an embodiment, the metal plate 11 may be formed with the opening 11-$h$ for the alignment mark which is formed by removing or drilling a portion of the main body 11-1. Although the opening 11-$h$ for the alignment mark is illustrated as a dot in FIG. 1, the opening 11-$h$ for the alignment mark may be clearly identified as shown in the enlarged view of FIG. 2. The alignment mark opening 11-$h$ enables the alignment mark positioned on a rear surface of the display panel 10 to be identified therethrough from a rear surface of the metal plate 11.

In an embodiment, the metal plate 11 includes a step (or recessed) portion 11-3 close or adjacent to the alignment mark opening 11-$h$ of the metal plate 11. For the step portion 11-3, which is a portion where a step is formed by partially etching a corresponding portion of the main body 11-1 of the metal plate 11. Although a level difference is not easily seen in FIG. 1 and FIG. 2 which are top plan views, the level difference may be clearly shown in FIG. 3 which is a perspective view. A thickness of the step portion 11-3 may be thinner than that of the body 11-1 due to a step, and a thickness ratio of the step portion 11-3 to the main body 11-1, that is, a ratio of thickness of the step portion 11-3 to a thickness of the main body 11-1, may be about 0.5. According to an embodiment, the thickness ratio may have a value of 0.1 or more and less than 1. The thickness of the main body 11-1 may have a thickness of about 1 millimeter (mm) or more and about 3 mm or less, e.g., about 2.4 mm, and a thickness of the step portion 11-3 may be about 0.5 mm or more and about 1.5 mm or less. In an embodiment, the step portion 11-3 may be formed by partially etching the main body 11-1, and in such an embodiment, the oxide film formed on the main body 11-1 is removed, such that light reflectance may become higher in the step portion 11-3 than in the main body 11-1.

The main body 11-1 is positioned between the alignment mark opening 11-*h* and the step portion 11-3, so that the alignment mark opening 11-*h* and the step portion 11-3 are separated from each other.

A spacer 11-2 (hereinafter also referred to as a rear spacer) positioned while overlapping at least a portion of the step portion 11-3 in a plan view, which is a portion of the step portion 11-3 close or adjacent to the alignment mark opening 11-*h*, is attached to the metal plate 11. The spacer 11-2 may have a structure that extends along one side of the metal plate 11. The spacer 11-2 may have a side that is aligned with a side of the metal plate 11 in a plan view, or may be positioned apart from the side of the metal plate 11. The spacer 11-2 and the metal plate 11 may be attached to each other by an adhesive layer such as a double-sided adhesive tape. In an embodiment, spacer 11-2 may be formed to have a thickness of about 100 micrometers (μm) or more and about 500 μm or less. In an embodiment, for example, the spacer 11-2 may be formed to have a thickness of about 200 μm.

Figure 14:
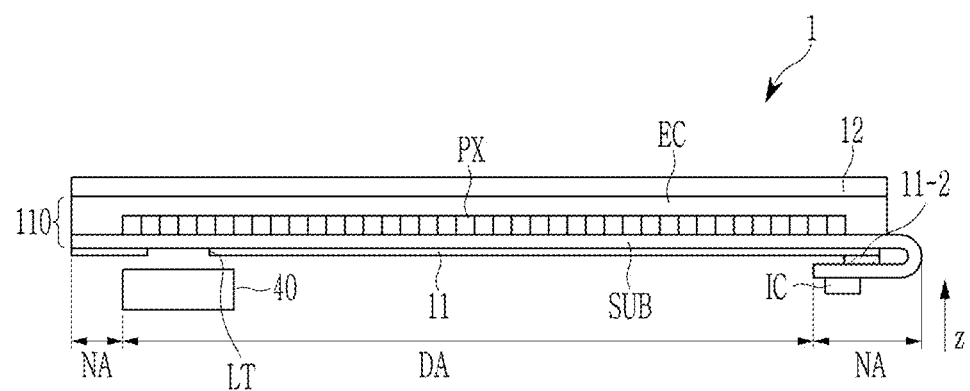
FIG. 14 illustrates a schematic cross-sectional view of an emissive display device according to an embodiment.

The spacer 11-2 is attached to the metal plate 11. In an embodiment, as illustrated in FIG. 14, when an insulating substrate SUB of the display panel is bent toward the rear surface of the metal plate 11, the spacer 11-2 serves to support the insulating substrate SUB of the display panel to have a predetermined distance with the metal plate 11.

Figure 3:
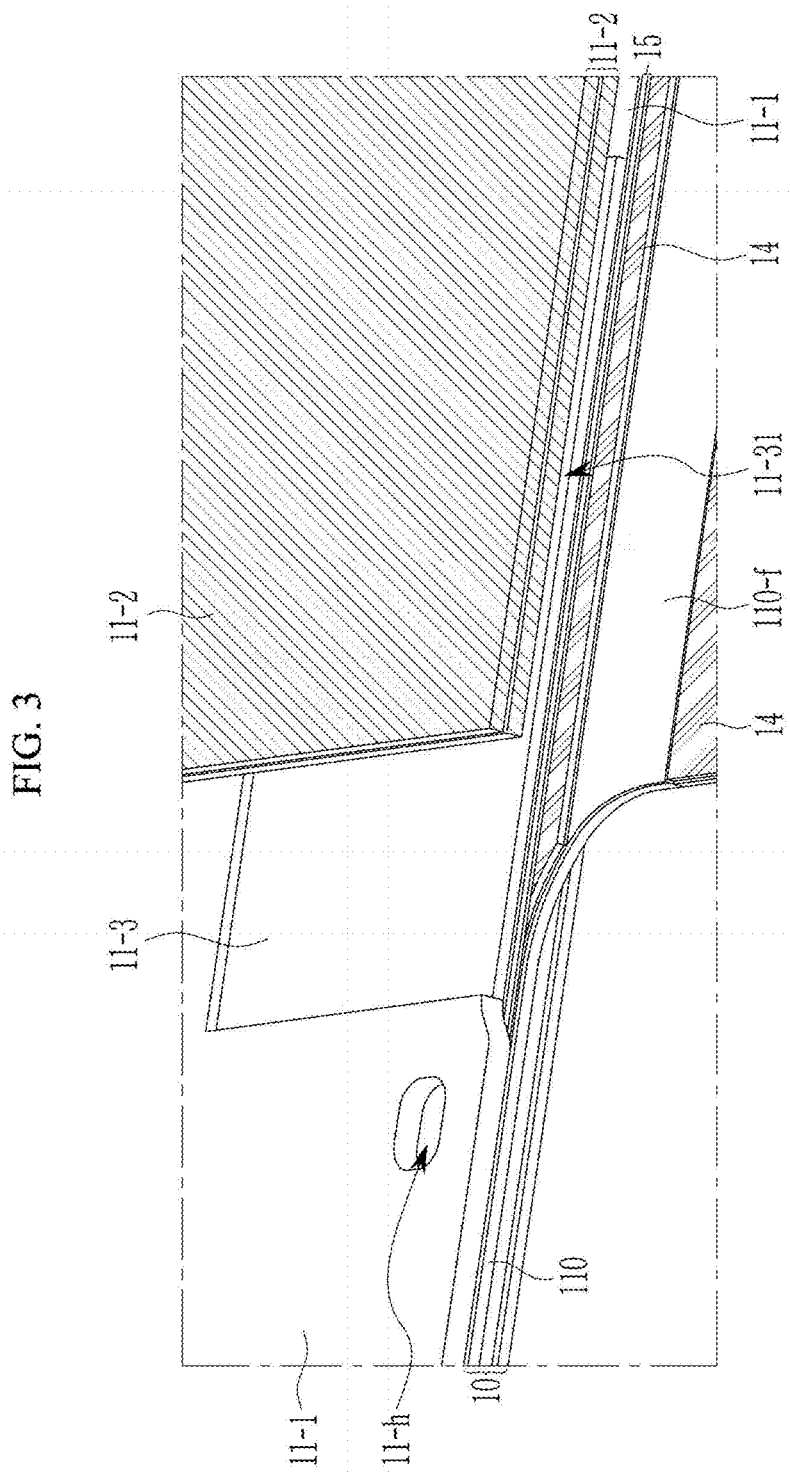
FIG. 3 illustrates an enlarged perspective view showing a portion of a rear surface of an emissive display device according to an embodiment.

The spacer 11-2 overlaps a portion of the step portion 11-3 in a plan view, a portion of the step portion 11-3 is exposed outside of the spacer 11-2 in a plan view, and a remaining portion of the step portion 11-3 overlaps the spacer 11-2 to be invisible in a plan view. Referring to FIG. 3 which is a perspective view and FIG. 4 which is a cross-sectional view, a lower portion of a portion of the spacer 11-2 does not come into contact with the metal plate 11 due to the step portion 11-3, and is separated by the space 11-31 above the step portion 11-3. However, since the remaining portion of the spacer 11-2 is in contact with the metal plate 11, the spacer 11-2 is stably attached to the metal plate 11.

In an embodiment, as shown in FIG. 1, the spacer 11-2 may have a quadrangular planar shape, but not being limited thereto. Alternatively, the spacer 11-2 may have one of other various planar shapes. The spacer 11-2 is attached at a predetermined interval based on the alignment mark of the display panel 10, which is identified through the alignment mark opening 11-*h*. A method of attaching the spacer 11-2 to an accurate position in an alignment device will be described in greater detail with reference to FIG. 4 and FIG. 5.

According to an embodiment, the metal plate 11 may further include a plurality of island-shaped protrusions 11-*ap* on a rear surface thereof. The island-shaped protrusions 11-*ap* may include at least two or more island-shaped protrusions, may all be portions having a flat circular structure except for the alignment mark opening 11-*h* in FIG. 1, and may be formed on the main body 11-1 of the metal plate 11 through an additional plating process. The island-shaped protrusions 11-*ap* may exhibit various characteristics of the metal plate 11 through a pattern formed on a rear surface of the metal plate 11.

Hereinafter, a structure in which the metal plate 11 is attached to the display panel 10 will be described in detail with reference to FIG. 2 and FIG. 3.

Figure 2:
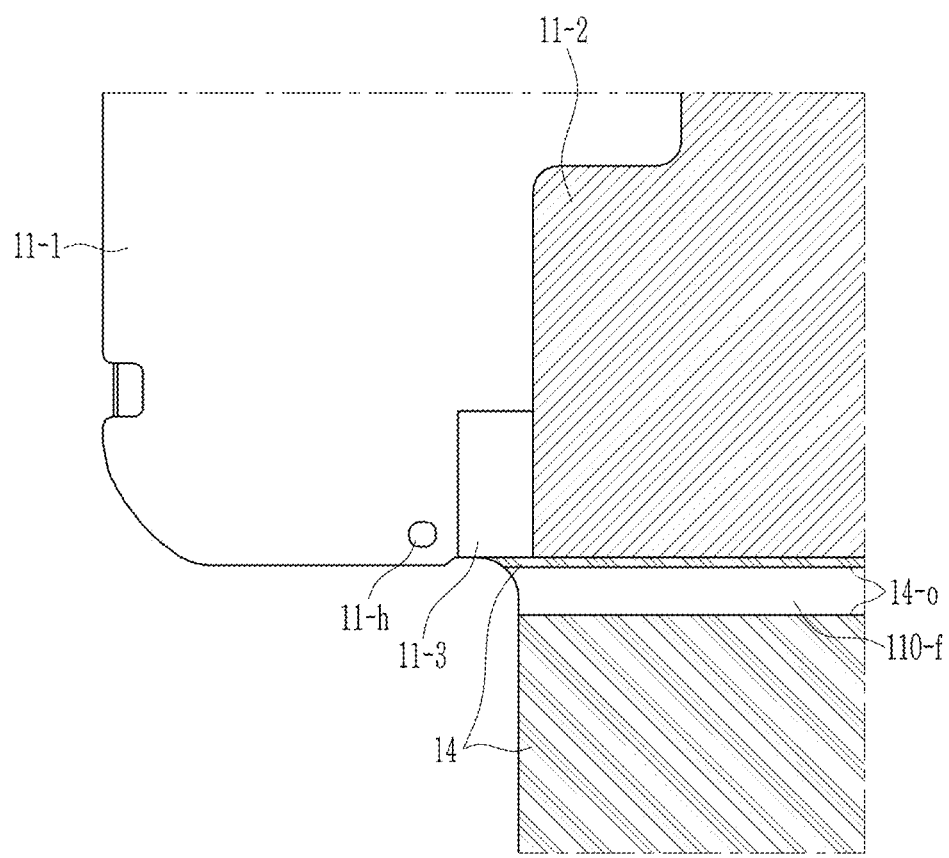
FIG. 2 illustrates an enlarged plan view showing a portion of a rear surface of an emissive display device according to an embodiment.

FIG. 2 illustrates an enlarged plan view showing a portion of a rear surface of an emissive display device according to an embodiment, and FIG. 3 illustrates an enlarged perspective view showing a portion of a rear surface of an emissive display device according to an embodiment.

In FIG. 2, a rear surface of a lower film layer 14 positioned below the display panel 10 outside the metal plate 11 is illustrated.

Figure 13:
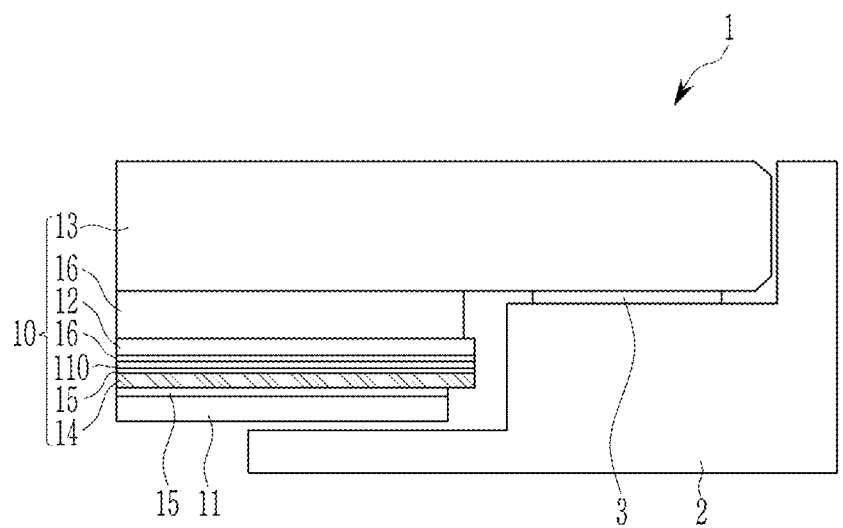
FIG. 13 illustrates a cross-sectional view showing a side surface of an emissive display device according to an embodiment.

The display panel 10 may include various components, and various deformable structures of the display panel 10 will be described with reference to FIG. 13, FIG. 14, and FIG. 15. In an embodiment, as shown in FIG. 13, the display panel 10 may include a display substrate 110 on which a pixel PX including a transistor and a light emitting diode is formed, and may include the lower film layer 14 attached to a rear surface of the display substrate 110.

The lower film layer 14 may include a cushion layer, and may include a non-transparent material having a black color. In an embodiment, as shown in FIG. 2, a partially open portion 14-*o* (hereinafter also referred to as an open portion of the lower film layer) is defined in the lower film layer 14 to overlap a portion where the display substrate 110 is bent toward a rear surface (hereinafter also referred to as a bending portion 110-*f*) in the lower film layer 14. Referring to FIG. 2 and FIG. 3, a rear surface of the display substrate 110 is exposed through the open portion 14-*o* of the lower film layer 14, and the exposed portion of the display substrate 110 through the open portion 14-*o* of the lower film layer 14 is the bending portion 110-*f* of the display substrate 110.

The display panel 10 and/or the display substrate 110 exposed to the outside of the metal plate 11 may be bent toward the rear surface, and FIG. 2 and FIG. 3 illustrate the display panel 10 in a state before the display panel 10 is bent toward the rear surface.

Referring to FIG. 2 and FIG. 3, the alignment mark opening 11-*h* and the step portion 11-3 of the metal plate 11 are positioned close or adjacent to each other, and a portion of the step portion 11-3 is covered by the spacer 11-2 and a remaining portion is not covered by the spacer 11-2. As a result, referring to FIG. 3 and FIG. 4, a space 11-31 is formed between the step portion 11-3 and the spacer 11-2 in a portion where the spacer 11-2 and the step portion 11-3 overlap. The step portion 11-3 may be thinner than the thickness of the metal plate 11, and a thickness ratio of the step portion 11-3 to the main body 11-1 of the metal plate 11 may have a value of 0.1 or more and less than 1, e.g., about 0.5.

Although not illustrated, the alignment mark opening 11-*h*, which is an opening corresponding to the alignment mark AM (see FIG. 4) positioned on the rear surface of the display panel 10 and/or the display substrate 110, allows an aligning apparatus 200 to detect the alignment mark AM.

Hereinafter, a method of performing position detection, alignment, and attachment in the aligning apparatus 200 will be described with reference to FIG. 4 and FIG. 5.

Figure 4:
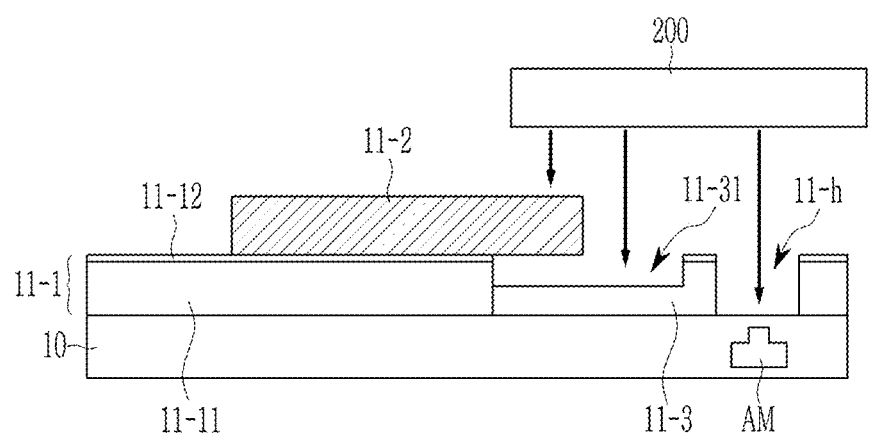
FIG. 4 illustrates a schematic cross-sectional view of an emission display device according to an embodiment.
Figure 5:
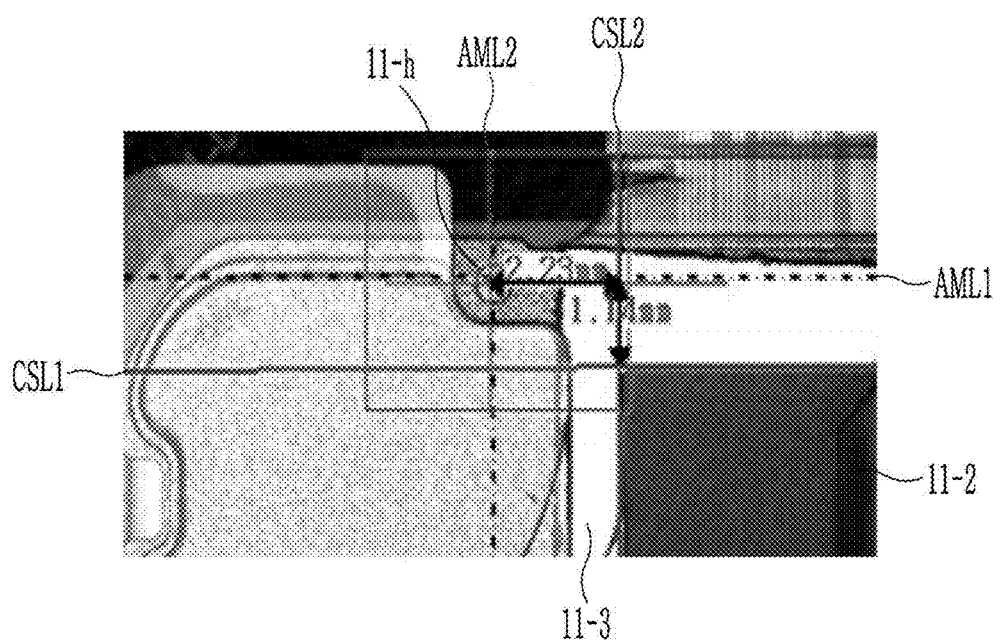
FIG. 5 illustrates a photograph obtained by photographing a rear surface of an emissive display device according to an embodiment in an alignment device.

FIG. 4 illustrates a schematic cross-sectional view of an emissive display device according to an embodiment, and FIG. 5 illustrates a photograph obtained by photographing a rear surface of an emissive display device according to an example in an alignment device.

Referring to FIG. 4, in an embodiment, the aligning apparatus 200 recognizes the alignment mark AM by photographing the rear surface of the emissive display device, and also recognizes the step portion 11-3 and the spacer 11-2 separately to identify a current position of the spacer 11-2. In such an embodiment, a picture taken by the aligning apparatus 200 may be the same as in FIG. 5, and in FIG. 5, additional reference lines AML1, AML2, CSL1, and CSL2 are additionally illustrated for easier recognition. Herein, the reference lines AML1 and AML2 indicated by dotted lines include the reference line AML1 in an x-axis direction and the reference line AML2 in a y-axis direction recognized by the aligning apparatus 200 by the alignment mark AM. In addition, the reference lines CSL1 and CSL2 indicated by solid lines include the reference line CSL1 in the x-axis direction and the reference line CSL2 in the y-axis direction along a boundary of the spacer 11-2 recognized by the aligning apparatus 200.

As for the boundary of spacer 11-2 recognized by the aligning apparatus 200, the spacer 11-2 is recognized as thick, but the step portion 11-3 is recognized as bright, so the boundary of the spacer 11-2 may be clearly recognized. That is, in an embodiment, the boundary of the spacer 11-2 may be clearly identified because the step portion 11-3 is recognized as bright because of high light reflectivity thereof.

In a case where, the main body 11-1 of the metal plate 11 is formed of a metal or an alloy to have high light reflectivity, but as illustrated in FIG. 4, an oxide film 11-12 may be actually formed on the main body 11-1, so that the light reflectivity is lowered, and thus the boundary of the spacer 11-2 may not be clearly recognized by the aligning apparatus 200.

In an embodiment, the step portion 11-3 is formed to remove the oxide film 11-12 and to expose the main body 11-1 formed of a metal or alloy, thereby increasing the light reflectivity and enabling the boundary of the spacer 11-2 to be clearly recognized by the aligning apparatus 200.

In FIG. 5, the step portion 11-3 positioned around the spacer 11-2 is brightly recognized by the aligning apparatus 200 for clear recognition of the boundary of the spacer 11-2. As a result, the reference lines CSL1 and CSL2 corresponding to a position of the spacer 11-2 are clearly recognized, and the spacer 11-2 is aligned at a predetermined position based on the reference lines AML1 and AML2 of the alignment mark AM.

The main body 11-1 of the metal plate 11 according to an embodiment may be formed of a titanium alloy, the oxide film 11-12 may be a titanium oxide film, and the titanium oxide film is not positioned on the step portion 11-3.

Hereinafter, an operation of the aligning apparatus 200 when the metal plate 11 that does not include the step portion 11-3 is used will be described with reference to FIG. 6 and FIG. 7.

Figure 6:
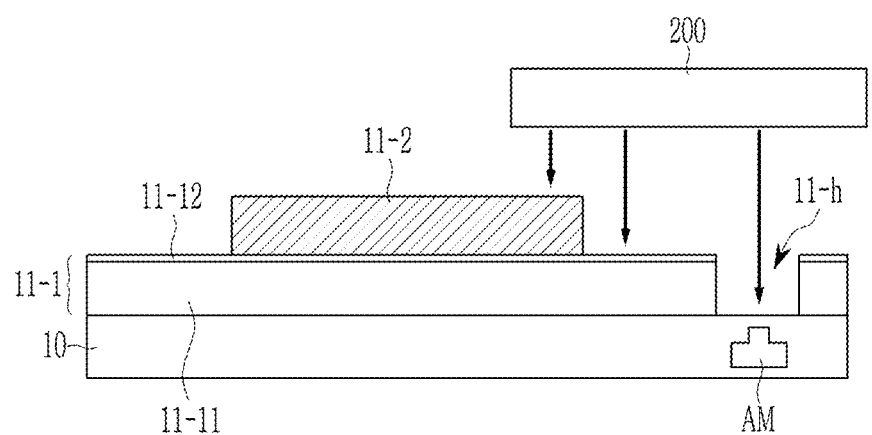
FIG. 6 illustrates a schematic cross-sectional view of an emissive display device according to a comparative example.
Figure 7:
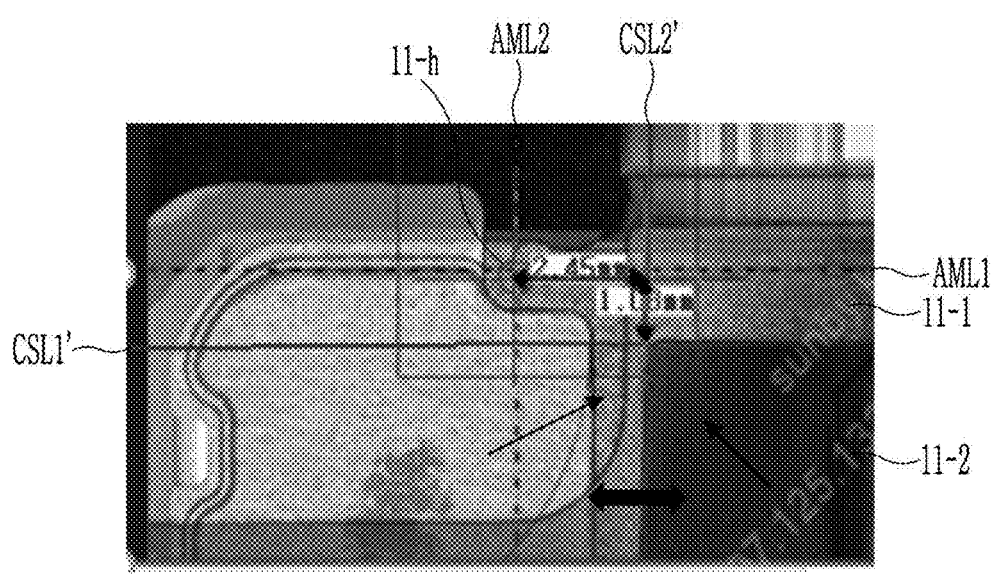
FIG. 7 illustrates a photograph obtained by photographing a rear surface of an emissive display device according to a comparative example in an alignment device.

FIG. 6 illustrates a schematic cross-sectional view of an emissive display device according to a comparative example, and FIG. 7 illustrates a photograph obtained by photographing a rear surface of an emissive display device according to a comparative example in an alignment device.

The display panel 10 according to a comparative example of FIG. 6 may be the same as that of FIG. 4, except for the structure of the metal plate 11 positioned on the rear surface thereof. That is, in the comparative example of FIG. 6, the oxide film 11-12 is disposed on an entire rear surface of the main body 11-1 except for the alignment mark opening 11-h, and a step portion that is formed in an embodiment of the invention to partially overlap the spacer 11-2 is not included. In the comparative example, the main body 11-1 of the metal plate 11 may be formed of a titanium alloy, and the oxide film 11-12 may be a titanium oxide film.

The oxide film 11-12 has low light reflectivity, and thus when recognized by the aligning apparatus 200, both the spacer 11-2 and the oxide film 11-12 are recognized as blurred, and a boundary between the spacer 11-2 and the oxide film 11-12 is not clearly visible.

That is, referring to FIG. 7 illustrating an example in which the comparative example was photographed by the aligning apparatus 200, the boundary between the spacer 11-2 and the oxide film 11-12 is not clearly recognized. When compared with FIG. 5, the aligning apparatus 200 in FIG. 5 clearly recognizes the reference lines CSL1 and CSL2 corresponding to the positions of the spacers 11-2, and aligns the spacer 11-2 at a predetermined position based on the reference lines AML1 and AML2 of the alignment mark AM, but in the comparative example of FIG. 7, the aligning apparatus 200 may not clearly see reference lines CSL1' and CSL2' corresponding to the position of the spacers 11-2, and it is difficult for the aligning apparatus 200 to clearly recognize the boundary between the spacer 11-2 and the oxide film 11-12, and thus the spacer 11-2 cannot be attached while being aligned at a correct position.

Hereinafter, the metal plate 11 and the emissive display device according to an alternative embodiment will be described with reference to FIG. 8 to FIG. 11.

In an alternative embodiment, as shown in FIG. 8 to FIG. 11, the metal plate 11 does not include the step portion 11-3, but instead, further includes a plating portion 11-EP, and the plating portion 11-EP is formed to have high light reflectivity.

Hereinafter, a structure of the metal plate 11 attached to a rear surface of an emissive display device according to an alternative embodiment will be described with reference to FIG. 8.

Figure 8:
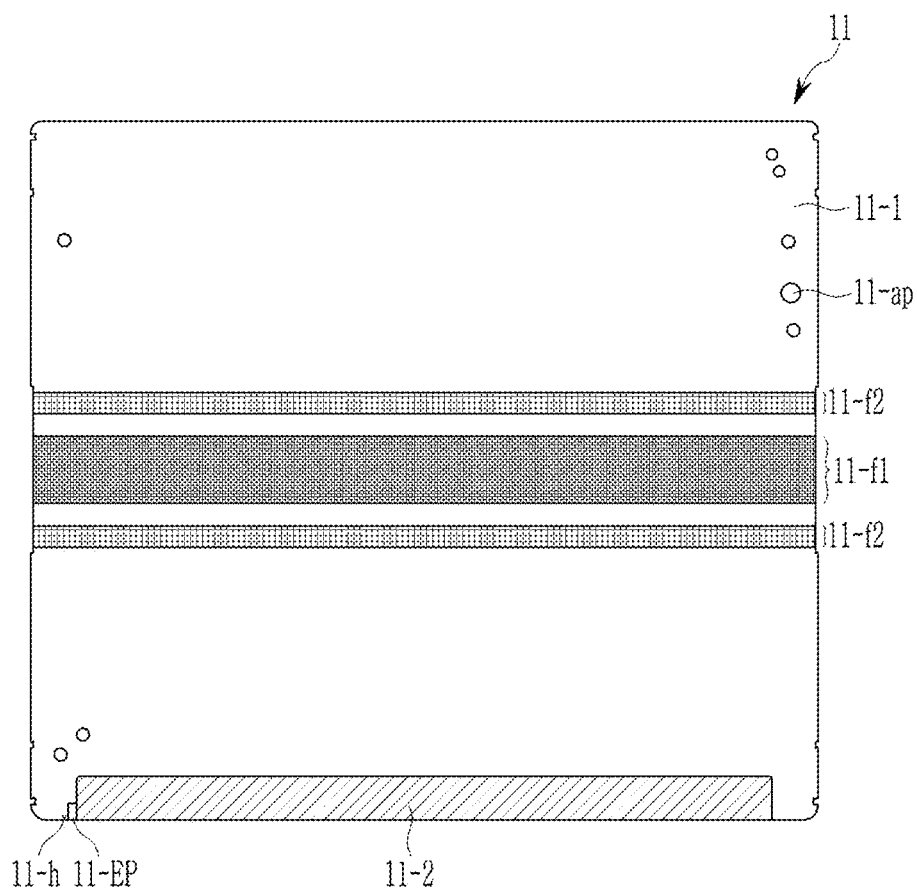
FIG. 8 illustrates a top plan view of a rear surface of a metal plate according to an alternative embodiment.

FIG. 8 illustrates a top plan view of a rear surface of a metal plate according to an alternative embodiment.

Similar to the metal plate 11 according to the embodiment of FIG. 1, the metal plate 11 according to the embodiment of FIG. 8 may have one main mesh pattern portion 11-f1 and two sub-mesh pattern portions 11-f2 at opposite sides thereof in the main body 11-1, and thus may be folded such that a cross-sectional shape has a dumbbell shape as illustrated in FIG. 12.

In addition, similar to the embodiment of FIG. 1, the metal plate 11 according to the embodiment of FIG. 8 may be formed with an alignment mark opening 11-h, which may be formed by removing or drilling a portion of the main body 11-1 to allow an alignment mark positioned on a rear surface of the display panel 10 to be identified from a rear surface thereof.

In addition, the main body 11-1 of the metal plate 11 according to the embodiment of FIG. 8 includes or is formed of a metal or a metal alloy, and an oxide film 11-12 (see FIG. 11) may be formed on at least one surface of the main body 11-1 while the metal or alloy constituting the main body 11-1 is oxidized. According to an embodiment, the main body 11-1 of the metal plate 11 may include or be formed of a titanium alloy, and an oxide film of the titanium alloy (hereinafter also referred to as a titanium oxide film) is positioned on one surface of the main body 11-1. In general, the metal or alloy constituting the main body 11-1 of the metal plate 11 has high light reflectivity, but the oxidized oxide film of the metal or alloy has relatively low light reflectivity. In particular, compared to the titanium alloy, a titanium oxide film has low reflectance of light.

In addition, the metal plate 11 according to the embodiment of FIG. 8 includes a plating portion 11-EP formed by being plated on the main body 11-1 of the metal plate 11 adjacently to the alignment mark opening 11-*h* of the metal plate 11. The plating portion 11-EP may be thinly plated on the main body 11-1 of the metal plate 11. The plating portion 11-EP may be plated with various metals and alloys, and a metal or alloy having high light reflectivity may be used. Hereinafter, an embodiment in which nickel (Ni) is used to perform plating will be mainly described. In such an embodiment, the plating portion 11-EP has high light reflectivity, and thus when recognized by the aligning apparatus 200, a boundary between the spacer 11-2 and the plating portion 11-EP may be clearly seen.

The main body 11-1 is positioned between the alignment mark opening 11-*h* and the plating portion 11-EP, so that the alignment mark opening 11-*h* and the plating portion 11-EP are separated from each other.

The spacer 11-2 positioned while overlapping at least a portion of the plating portion 11-EP in a plan view, which is a portion close or adjacent to the alignment mark opening 11-*h*, is attached to the metal plate 11. The spacer 11-2 may have a structure that extends along one side of the metal plate 11. The spacer 11-2 may have a side that is aligned with a side of the metal plate 11 in a plan view, or may be positioned apart from the side of the metal plate 11. The spacer 11-2 and the metal plate 11 may be attached to each other by an adhesive layer such as a double-sided adhesive tape.

The spacer 11-2 is attached to the metal plate 11, and as illustrated in FIG. 14, when the insulating substrate SUB of the display panel is bent toward the rear surface of the metal plate 11, the spacer 11-2 serves to support the insulating substrate SUB of the display panel to have a predetermined distance with the metal plate 11.

Figure 10:
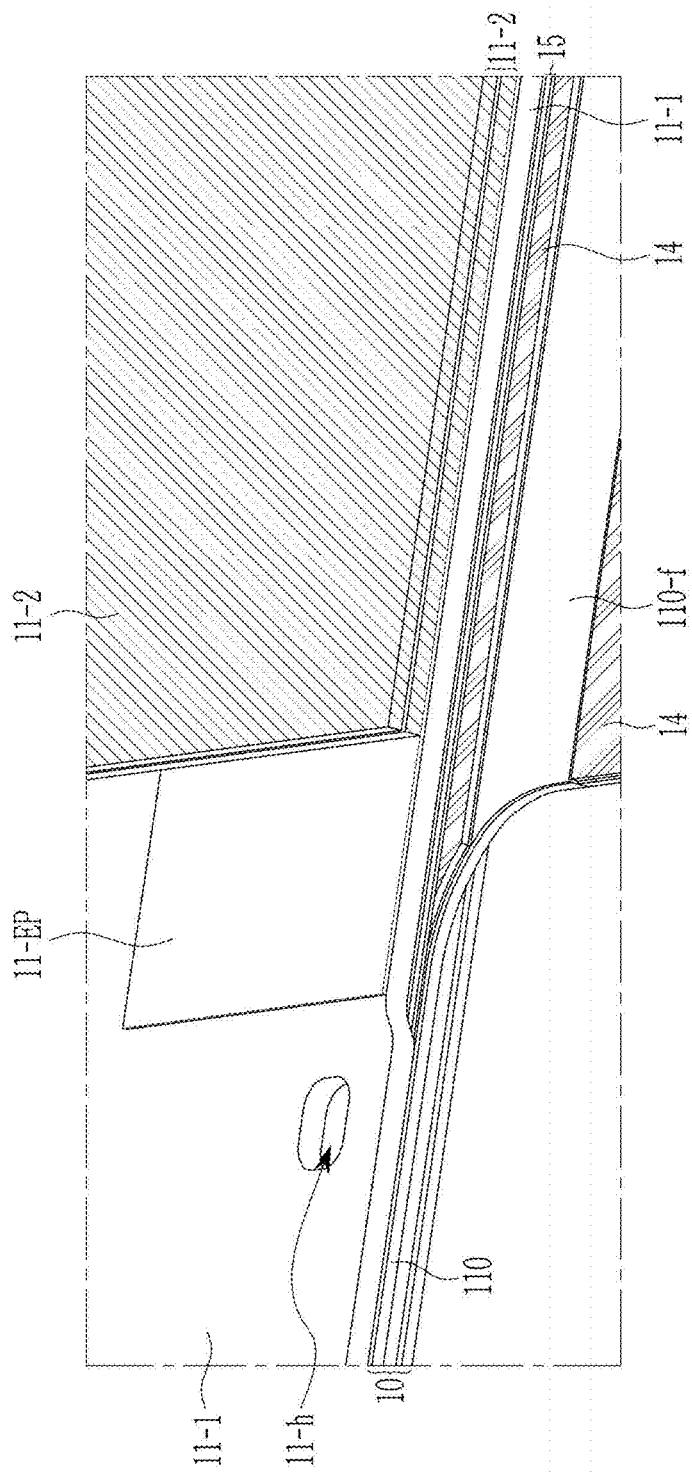
FIG. 10 illustrates an enlarged perspective view showing a portion of a rear surface of an emissive display device according to an alternative embodiment.

The spacer 11-2 overlaps a portion of the plating portion 11-EP in a plan view, a portion of the plating portion 11-EP is exposed outside of the spacer 11-2 in a plan view, and a remaining portion of the plating portion 11-EP overlaps the spacer 11-2 to be invisible in a plan view. Referring to FIG. 10 which is a perspective view and FIG. 11 which is a cross-sectional view, a lower portion of a portion of the spacer 11-2 has a structure that is not in contact with the metal plate 11 by the plating portion 11-EP and is in contact with the plating portion 11-EP.

In an embodiment, as shown in FIG. 8, the spacer 11-2 may have a quadrangular planar shape, but not being limited thereto. Alternatively, the spacer 11-2 may have one of other various planar shapes. In an embodiment, the spacer 11-2 is attached at a predetermined interval based on the alignment mark of the display panel 10, which can be identified through the alignment mark opening 11-*h*. In such an embodiment, since light reflectivity of the plating portion 11-EP is high, the aligning apparatus 200 may easily recognize a boundary with the spacer 11-2 to attach the spacer 11-2 to a correct position.

According to an embodiment, additionally, the metal plate 11 may further include a plurality of island-shaped protrusions 11-*ap* on a rear surface of the main body 11-1. The island-shaped protrusions 11-*ap* may include at least two or more island-shaped protrusions, may all be portions having a flat circular structure except for the alignment mark opening 11-*h* in FIG. 8, and may be formed on the main body 11-1 of the metal plate 11 through an additional plating process. In an embodiment, the plating portion 11-EP and the island-shaped protrusions 11-*ap* may be formed through a same plating process, and may be plated with a same metal or alloy according to an embodiment. The island-shaped protrusions 11-*ap* may be formed by being plated with nickel (Ni) through a same process as the plating portion 11-EP.

Hereinafter, a structure in which the metal plate 11 is attached to the display panel 10 will be described in detail with reference to FIG. 9 and FIG. 10.

Figure 9:
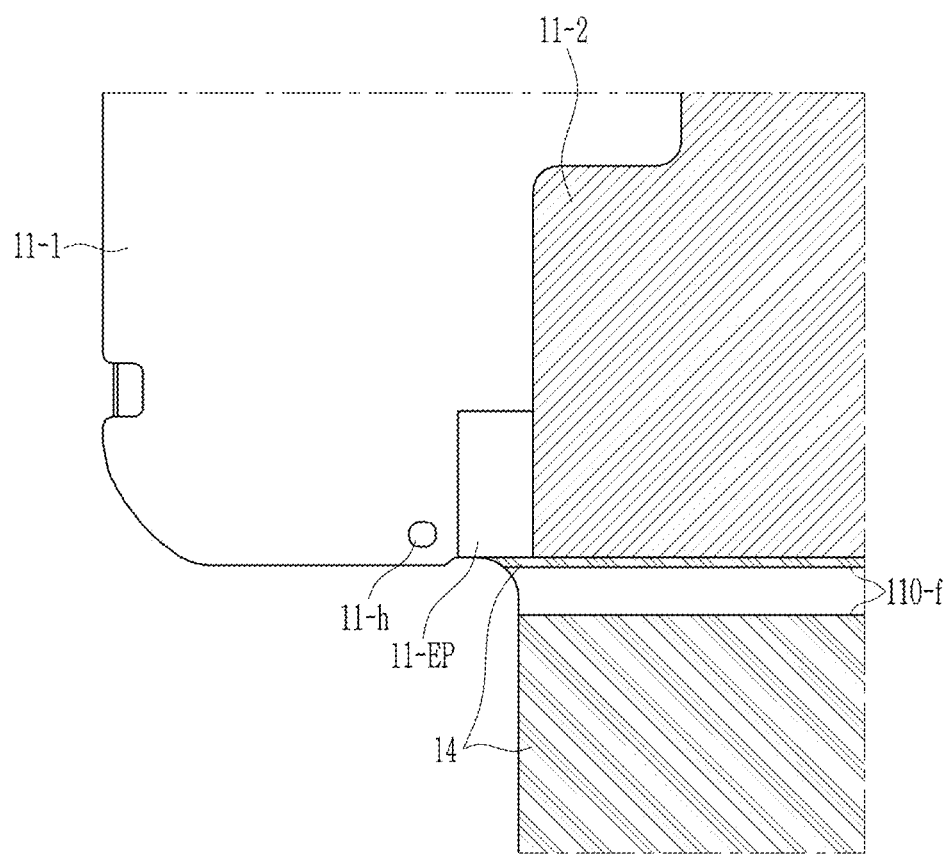
FIG. 9 illustrates an enlarged plan view showing a portion of a rear surface of an emissive display device according to an alternative embodiment.

FIG. 9 illustrates an enlarged plan view showing a portion of a rear surface of an emissive display device according to an alternative embodiment, and FIG. illustrates an enlarged perspective view showing a portion of a rear surface of an emissive display device according to an alternative embodiment.

Figure 11:
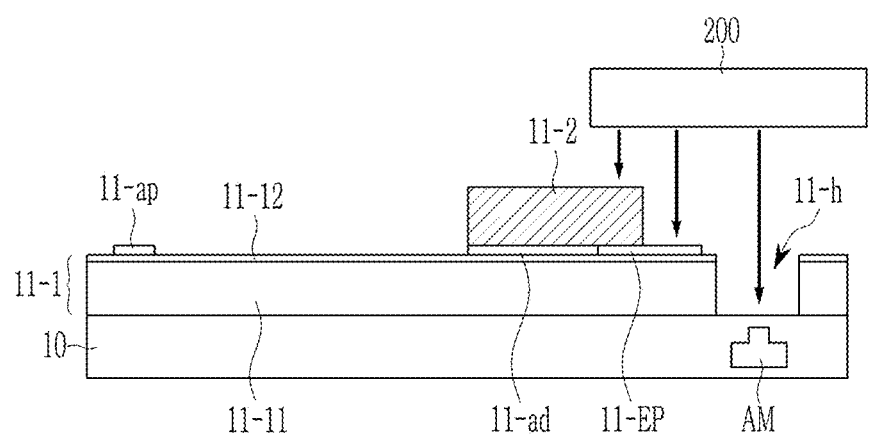
FIG. 11 illustrates a schematic cross-sectional view of an emissive display device according to an alternative embodiment.

Referring to FIG. 9, although there is no significant difference from the plan view of FIG. 2, referring to FIG. 10, unlike the perspective view of FIG. 3, in an alternative embodiment, the plating portion 11-EP is thinly plated on the main body 11-1 of the metal plate 11 so that no step is formed. As a result, the plating portion 11-EP is positioned on a rear surface of the main body 11-1 of the metal plate 11, and the spacer 11-2 is positioned on the rear surface thereof. The spacer 11-2 may be formed to be wider than the plating portion 11-EP, so that a portion of the spacer 11-2 overlaps the plating portion 11-EP in a plan view, and a remaining portion thereof of the spacers 11-2 may be attached to the main body 11-1 through an adhesive layer 11-*ad*. FIG. 11 illustrates that the adhesive layer 11-*ad* is not positioned on the plating portion 11-EP, but according to an embodiment, the plating portion 11-EP and the spacer 11-2 may also be attached by the adhesive layer 11-*ad*. In addition, a portion of the plating portion 11-EP is exposed to the outside without overlapping the spacer 11-2 in a plan view.

Hereinafter, an embodiment of a method of performing position detection, alignment, and attachment in the aligning apparatus 200 will be described with reference to FIG. 11.

FIG. 11 illustrates a schematic cross-sectional view of an emissive display device according to an alternative embodiment.

Referring to FIG. 11, an embodiment of the aligning apparatus 200 recognizes the alignment mark AM by photographing the rear surface of the emissive display device, and also recognizes the plating portion 11-EP and the spacer 11-2 separately to identify a current position of the spacer 11-2. In such an embodiment, as described above with reference to FIG. 5, a photograph taken by the aligning apparatus 200 may be brightly recognized because of high reflectivity of the plating portion 11-EP, and the spacer 11-2 may be darkly recognized, so that a boundary of the spacer 11-2 may be easily recognized. As a result, spacers 11-2 may be positioned without misalignment at regular intervals based on the alignment mark AM.

Hereinafter, a cross-sectional structure of an emissive display device folded to have a dumbbell shape will be briefly described with reference to FIG. 12.

FIG. 12 illustrates a schematic cross-sectional view of an emissive display device according to an embodiment.

In FIG. 12, for convenience of illustration, only the insulating substrate SUB, which is a most basic part of the display substrate 110 on which a pixel PX including a transistor and a light emitting diode is formed in the display panel 10 of the emissive display device is schematically illustrated. Various layers may be positioned on the insulating substrate SUB, and various embodiments will be described in detail with reference to FIG. 13 to FIG. 15.

The insulating substrate SUB according to an embodiment may have a cross-section having a dumbbell shape while being folded. In such an embodiment, the spacer 11-2 is positioned between two folded portions of the insulation substrate SUB such that the two portions have a certain distance from each other, thereby preventing occurrence of cracks in bending portions when the insulating substrate SUB is folded too much. In addition, a driver IC may be attached in the form of a chip to a portion that is folded toward a rear surface of a display area of the emissive display device as a portion of the folded insulating substrate SUB. In such a structure, no separate flexible printed circuit board is attached to the insulating substrate SUB.

FIG. 12 illustrates an embodiment having a structure in which the driver IC is positioned toward the rear surface of the display area while the insulating substrate SUB is folded. Alternatively, the display area may be folded, and in such an embodiment, a cross-section of the insulating substrate SUB after being folded may have the dumbbell shape. In an embodiment in which the display area is folded to have the dumbbell shape, the emissive display device may have a structure of the metal plate 11 as illustrated in FIG. 1 and FIG. 8. That is, the metal plate 11 as that of FIG. 1 or FIG. 8 may be attached to the rear surface of the insulating substrate SUB, and one main mesh pattern portion 11-*f*1 and the metal plate 11 may include one main mesh pattern portion 11-*f*1 and two sub-mesh pattern portions 11-*f*2. When folded to have a first diameter by the one main mesh pattern portion 11-*f*1 and the two sub-mesh pattern portions 11-*f*2, the emissive display device may have the dumbbell shape as a gap between portions that are not folded while being additionally folded by two mesh pattern portions 11-*f*2 at opposite sides is formed at a narrower interval than that of the first diameter.

In addition, one insulating substrate SUB may have the dumbbell shape while being folded in a plurality of areas, and may be folded to have the dumbbell shape in three areas.

In an embodiment, where the driver IC is positioned toward the rear surface of the display area while the insulating substrate SUB is folded, the emissive display device may have a simple structure rather than the dumbbell shape as illustrated in FIG. 14.

Although the display panel 10 constituting the emissive display device has been schematically described above, hereinafter, cross-sectional structures of various display panels 10 and emissive display devices will be described in detail with reference to FIG. 13 to FIG. 15.

Hereinafter, a cross-sectional structure of the emissive display device according to an embodiment will be described with reference to FIG. 13.

FIG. 13 illustrates a cross-sectional view showing a side surface of an emissive display device according to an embodiment.

FIG. 13 illustrates a cross-sectional structure of the emissive display device 1 in more detail, and further illustrates a frame 2 positioned outside the light emitting display device 1 to protect the display panel 10. A window 13 and the frame 2 which are portions of the display panel 10 may be attached to each other through a double-sided adhesive tape 3.

Referring to FIG. 13, the display panel 10 used in the emissive display device 1 further includes the window 13, a polarizer (or a polarizing plate) 12, and a lower film layer 14 therebelow or thereabove based on the display substrate 110 on which the pixel PX including a transistor and a light emitting diode is formed, and the metal plate 11 is positioned under the display panel 10.

In addition, in FIG. 13, adhesive layers 15 and 16 for attachment between the respective components are additionally illustrated.

The polarizer 12 may be further included on the display substrate 110, and serves to prevent light incident from the outside from being visible while being reflected by an upper layer of the display substrate 110. According to an embodiment, the polarizer 12 may further include a phase delay layer. The display substrate 110 and the polarizer 12 are attached to each other by the first adhesive layer 16.

In addition, a window 13 for protecting the display substrate 110 may be positioned above the upper portion of the polarizer 12, and may include a material such as plastic or glass. The polarizer 12 and the window 13 are attached to each other by the first adhesive layer 16.

Herein, for the first adhesive layer 16, which is an adhesive layer positioned on a front surface of the display substrate 110, an adhesive material having high transmittance of visible light emitted from the pixel PX of the display substrate 110 may be used. Since the transmittance is affected by the difference in transmittance at each boundary, two first adhesive layers 16 positioned between the polarizer 12 and the display substrate 110 and between the window 13 and the polarizing plate 12 may include different materials from each other.

A lower film layer 14 for protecting a rear surface of the display substrate 110 may be further included between the rear surface of the display substrate 110 and the metal plate 11 on the rear surface of the display substrate 110. The lower film layer 14, which is a layer for protecting the display substrate 110 from impact applied from below, may include a cushion layer, and is attached to the display substrate 110 by a second adhesive layer 15. The lower film layer 14 may have a characteristic of absorbing light such that light emitted from the display substrate 110 is not transferred to the outside, or may have a black color.

The metal plate 11 is attached to a rear surface of the lower film layer 14 by the second adhesive layer 15. The metal plate 11 may include or be formed of a metal or an alloy.

Hereinafter, a cross-sectional structure of an embodiment of an emissive display device will be described with reference to FIG. 14.

FIG. 14 illustrates a schematic cross-sectional view of an emissive display device according to an embodiment.

In an embodiment, as shown in FIG. 14, the window 13 and the lower film layer 14 that can be attached to top and bottom of the display panel 10 are omitted.

Referring to FIG. 14, an embodiment, the emissive display device 1 may further include an optical element 40. First, the display substrate 110 including the pixel PX will be described.

The display substrate 110 includes a display area DA including a plurality of pixels PX to display an image, and a non-display area NA that surrounds the display area DA and does not display an image. The pixels PX are positioned in the display area DA, and one pixel PX may be divided into a light emitting device (also referred to as a light emitting diode) and a pixel circuit portion that supplies a current to the light emitting device and includes a plurality of transistors.

Signal lines for transferring various signals and voltages applied to the pixels PX are positioned to extend in the non-display area NA, and the driver IC that generates a signal applied to the pixel PX may also be positioned according to an embodiment. In an embodiment, as shown in FIG. 14, the driver IC may be attached as an integrated circuit chip, and additionally, the emissive display device 1 may further include a driver that is formed together with the pixel PX in a same process in some regions of the display substrate 110. Referring to FIG. 14, a structure in which the driver IC is attached to a folded portion while the insulating substrate SUB is folded toward a rear surface thereof is illustrated. The insulating substrate SUB on which the driver IC is positioned has a structure in which a constant distance is maintained from another portion of the insulating substrate SUB by the spacer 11-2. FIG. 14 illustrates an embodiment where the insulating substrate SUB is bent to have a structure other than a dumbbell shape, but not being limited thereto. Alternatively, the insulating substrate SUB may be folded to have a dumbbell shape according to an embodiment.

In an embodiment, the display substrate 110 may include an encapsulation layer EC covering the pixels PX to block an inflow of moisture or air from the outside. The pixels PX may be formed on the insulation substrate SUB, and the insulating substrate SUB may include or be formed of a flexible material such as plastic or polyimide (PI) and may further include an additional insulating layer (e.g., a buffer layer or a barrier layer).

In an embodiment, as shown in FIG. 14, the optical element 40 is formed on rear surfaces of the display substrate 110 and the metal plate 11, and the metal plate 11 additionally forms a light transmission area LT to correspond to a position of the optical element 40. In such an embodiment, the optical element 40 may overlap the display area DA of the display substrate 110 in a plan view, and thus the display area DA of the display substrate 110 may include a display area having high light transmittance (hereinafter also referred to as a second display area or a device area).

A shape and size of the light transmission area LT of the metal plate 11 may be substantially the same as those of the second display area, and may be smaller than that of the optical element 40. In such an embodiment, only a portion of the optical element 40 that emits light or receives light (hereinafter referred to as a light input/output unit) may be positioned within the light transmission area LT and the second display area. That is, a portion of the optical element 40 may be positioned outside the light transmission area LT and the second display area.

Referring to FIG. 14, light provided from the optical element 40 may be provided to a front surface of the emissive display device through the light transmission area LT of the metal plate 11 and the second display area of the display substrate 110, and after being reflected from an external target, light is incident on the optical element 40 again to operate the optical element 40. According to an embodiment, the optical element 40 may not emit light and may only receive light reflected from the target object, or may only emit light and not receive light. Light used (e.g., emitted or received) by the optical element 40 includes visible rays, infrared rays, and ultraviolet rays. In an embodiment, the optical element 40 includes a sensor, a camera, a flash, and the like. In an embodiment, where the optical element 40 is a sensor, the optical element 40 may be a proximity sensor, an illuminance sensor, an infrared sensor, or an ultraviolet sensor.

Hereinafter, a cross-sectional structure of the emissive display device 1 according to an alternative embodiment will be described with reference to FIG. 15.

Figure 15:
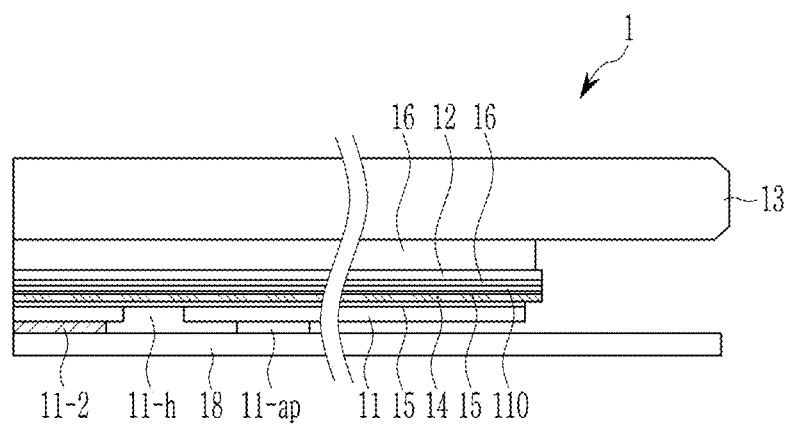
FIG. 15 illustrates a cross-sectional view of an emission display device according to an alternative embodiment.

FIG. 15 illustrates a cross-sectional view of an emission display device according to an alternative embodiment.

In FIG. 15, an embodiment of the emissive display device 1 in which a protective film 18 is additionally included on the rear surface of the metal plate 11 is illustrated.

The protective film 18, which is positioned on the rear surface of the metal plate 11 to protect the metal plate 11, is temporarily attached to protect the metal plate 11 and is not included in an actual electronic device including the emissive display device 1. However, the emission display device may be sold with a protective film 18 attached to the rear surface of the emissive display device 1, and may be used to manufacture electronic devices after an electronic equipment manufacturer who purchased the emission display device removes the protective film 18.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An emissive display device comprising:
 a display panel including a plurality of pixels and an alignment mark positioned on a rear surface thereof;
 a metal plate disposed on the rear surface of the display panel, wherein an alignment mark opening corresponding to the alignment mark is defined through the metal plate, and the metal plate includes a step portion positioned close to the alignment mark opening; and
 a spacer disposed to overlap at least a portion of the step portion in a plan view and attached to a rear surface of the metal plate.

2. The emissive display device of claim 1, wherein the metal plate includes a main body including a metal or an alloy, and an oxide film disposed on the main body.

3. The emissive display device of claim 2, wherein the main body includes titanium, and the oxide film is a titanium oxide film.

4. The emissive display device of claim 2, wherein the oxide film is not in the step portion.

5. The emissive display device of claim 4, wherein a thickness of the step portion is smaller than a thickness of the main body.

6. The emissive display device of claim 5, wherein a portion of the spacer overlapping the step portion in the plan view is separated from the metal plate by a space above the step portion, and a remaining portion of the spacer is in contact with the metal plate.

7. The emissive display device of claim 2, wherein the metal plate further includes one main mesh pattern portion and two sub-mesh pattern portions which are respectively positioned at opposite sides of the main mesh pattern portion.

8. The emissive display device of claim 7, wherein the display panel further includes a display substrate on which a pixel including a transistor and a light emitting diode is disposed, and a lower film layer which is attached to a rear surface of the display substrate, an open portion is defined through the lower film layer to overlap a bending portion of the display substrate, and the bending portion of the display substrate is folded toward a rear surface and a distance between bent portions of the display substrate is maintained by the spacer.

9. The emissive display device of claim 8, wherein the display panel has a cross-sectional shape of a dumbbell in a state where the display panel is bent.

10. The emissive display device of claim 8, further comprising:
a driver positioned on a portion of the display substrate bent toward the rear surface thereof to overlap a display area.

11. The emissive display device of claim 2, further comprising
a plurality of island-shaped protrusions positioned on a rear surface of the metal plate, and
the island-shaped protrusions are formed by plating.

12. An emissive display device comprising:
a display panel including a plurality of pixels and an alignment mark positioned on a rear surface thereof;
a metal plate disposed on the rear surface of the display panel, wherein an alignment mark opening corresponding to the alignment mark is defined through the metal plate, and a plating portion is positioned on the metal plate to be close to the alignment mark opening; and
a spacer disposed to overlap at least a portion of the plating portion in a plan view and attached to a rear surface of the metal plate.

13. The emissive display device of claim 12, wherein the metal plate includes a main body including a metal or an alloy, and an oxide film disposed on the main body.

14. The emissive display device of claim 13, wherein the main body includes titanium, and
the oxide film is a titanium oxide film.

15. The emissive display device of claim 13, wherein the plating portion is positioned on the oxide film.

16. The emissive display device of claim 15, further comprising
a plurality of island-shaped protrusions positioned on a rear surface of the metal plate, and
the island-shaped protrusions are formed by plating.

17. The emissive display device of claim 16, wherein the island-shaped protrusions includes a same material as a material of the plating portion.

18. The emissive display device of claim 17, wherein the island-shaped protrusions and the plating portion are portions plated on the metal plate with nickel.

19. The emissive display device of claim 13, wherein the metal plate further includes one main mesh pattern portion and two sub-mesh pattern portions which are respectively positioned at opposite sides of the main mesh pattern portion.

20. The emissive display device of claim 19, wherein the display panel has a cross-sectional shape of a dumbbell in a state where the display panel is bent.

* * * * *